US011758758B2

(12) United States Patent
Maruyama

(10) Patent No.: US 11,758,758 B2
(45) Date of Patent: Sep. 12, 2023

(54) DISPLAY DEVICE INCLUDING BENDING REGION INCLUDING LAMINATED FIRST AND SECOND RESIN LAYERS

(71) Applicant: Japan Display Inc., Tokyo (JP)

(72) Inventor: Satoshi Maruyama, Minato-ku (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/689,375

(22) Filed: Mar. 8, 2022

(65) Prior Publication Data

US 2022/0199954 A1    Jun. 23, 2022

Related U.S. Application Data

(63) Continuation of application No. 16/922,236, filed on Jul. 7, 2020, now Pat. No. 11,335,885, which is a continuation of application No. PCT/JP2019/000518, filed on Jan. 10, 2019.

(30) Foreign Application Priority Data

Jan. 16, 2018    (JP) .................................. 2018-005057

(51) Int. Cl.
*H10K 50/844*    (2023.01)
*H10K 50/842*    (2023.01)
*H10K 71/00*    (2023.01)
*H10K 102/00*    (2023.01)

(52) U.S. Cl.
CPC ....... *H10K 50/844* (2023.02); *H10K 50/8426* (2023.02); *H10K 71/00* (2023.02); *H10K 2102/00* (2023.02); *H10K 2102/311* (2023.02)

(58) Field of Classification Search
CPC . H01L 51/5253; H01L 51/5246; H01L 51/56; H10K 50/844; H10K 50/8426
See application file for complete search history.

(56) References Cited

U.S. PATENT DOCUMENTS

| 2017/0294620 A1* | 10/2017 | Park ..................... H01L 51/5284 |
| 2017/0352692 A1* | 12/2017 | Lee ......................... H01L 27/124 |
| 2018/0090698 A1* | 3/2018 | Jeong ..................... H01L 51/003 |
| 2018/0151644 A1* | 5/2018 | Han ........................ H01L 51/524 |
| 2018/0175323 A1* | 6/2018 | Ahn ..................... H01L 51/5253 |

* cited by examiner

*Primary Examiner* — Michael Jung
(74) *Attorney, Agent, or Firm* — Maier & Maier, PLLC

(57) ABSTRACT

The display device includes a substrate including a first resin layer, a second resin layer overlapping the first resin layer, and a first inorganic insulating layer between the first resin layer and the second resin layer, and having flexibility, a display region provided on the substrate, a terminal region arranged outside the display region on the substrate, and a bending region arranged between the display region and the terminal region. A thickness of the second resin layer is larger than a thickness of the first resin layer. The substrate includes a first region and a second region. The first resin layer, the first inorganic insulating layer, and the second resin layer are laminated in the first region. The first resin layer and the second resin layer are laminated in the second region and the first inorganic insulating layer is not laminated in the second region.

8 Claims, 15 Drawing Sheets

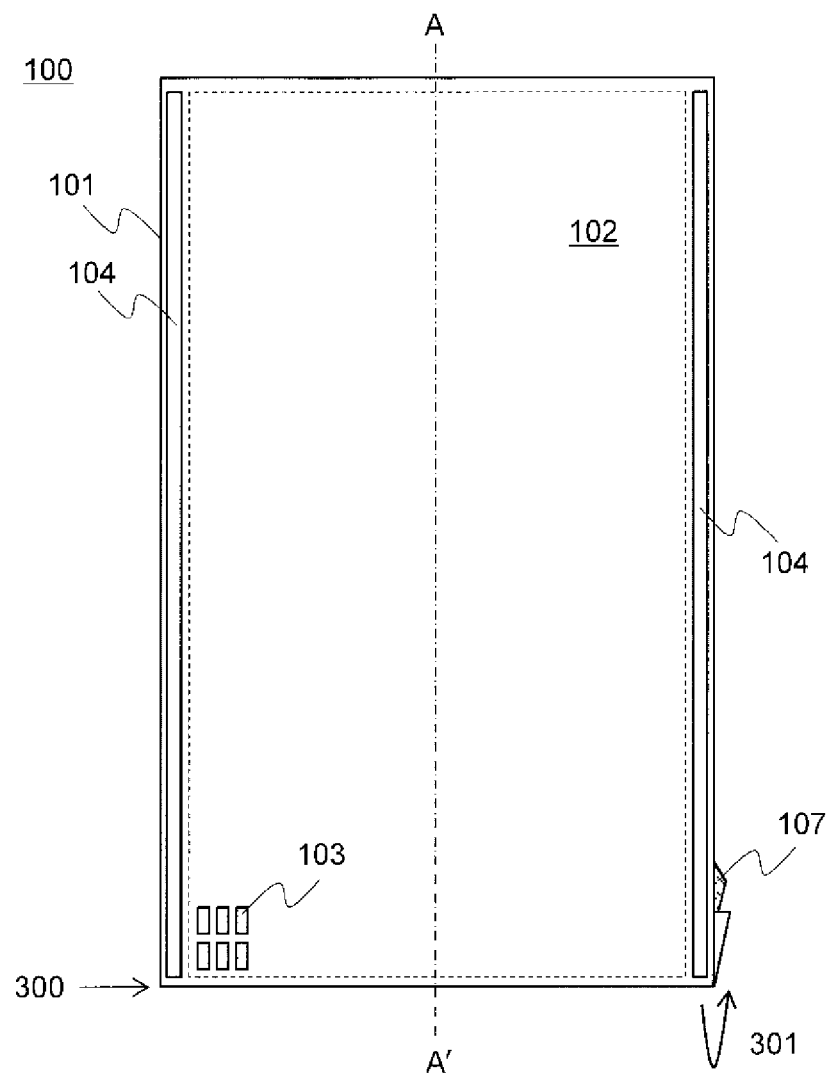

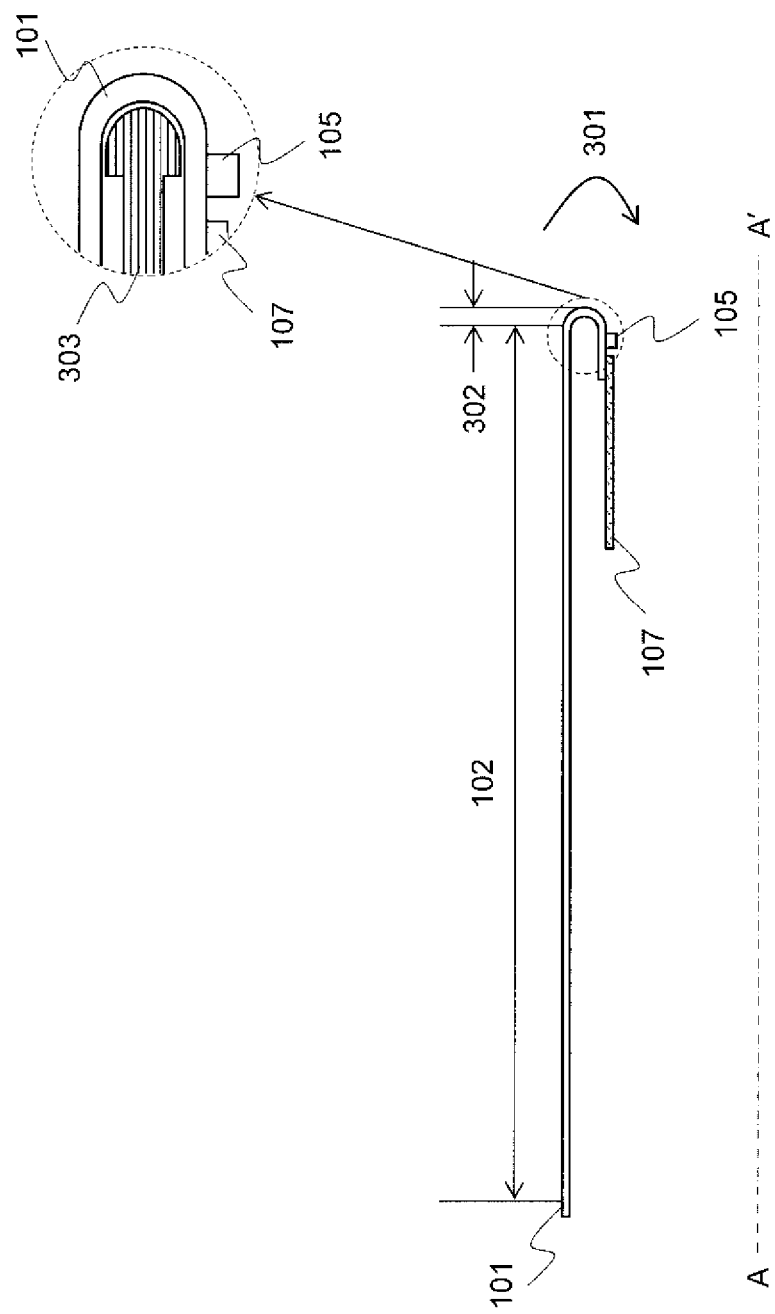

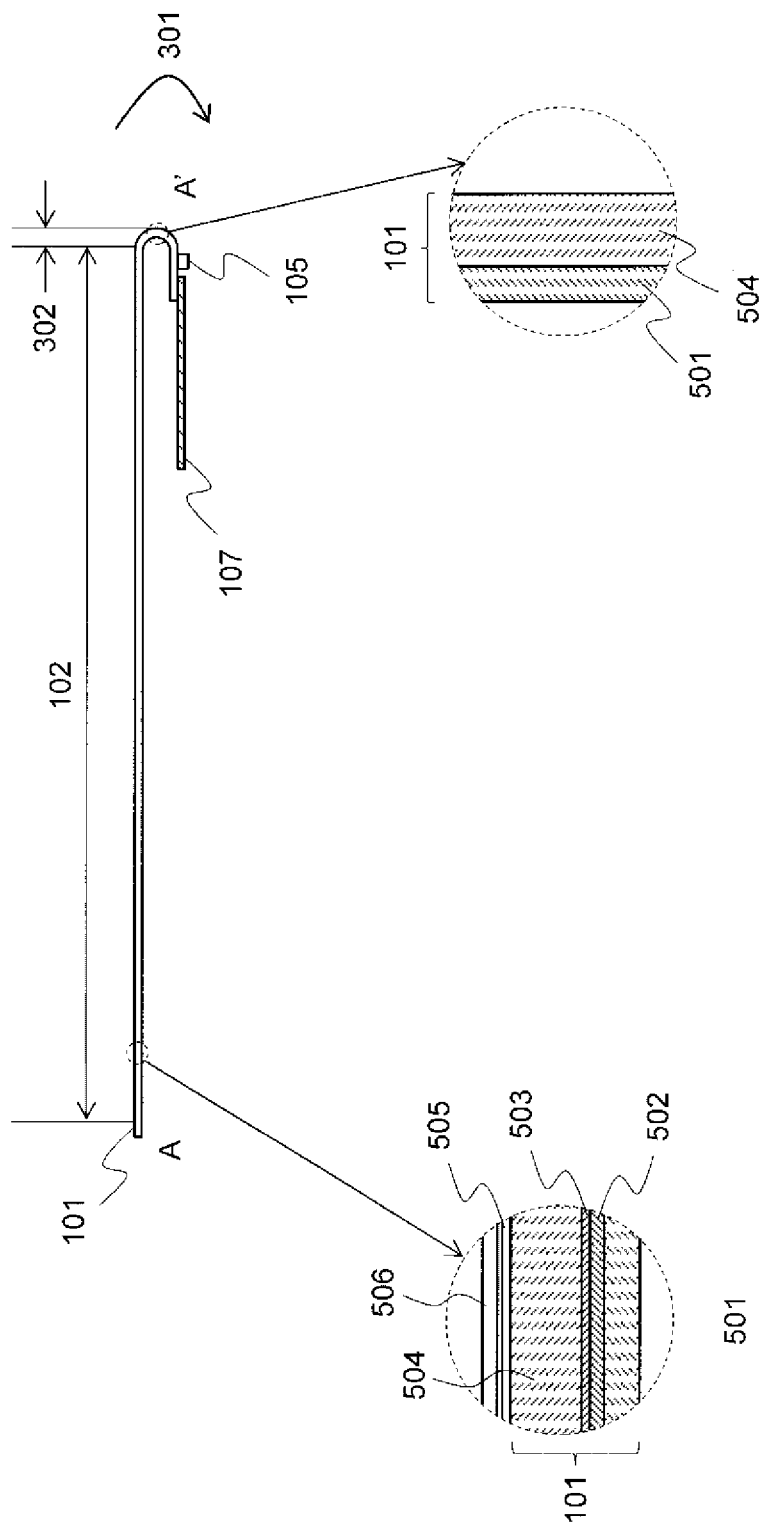

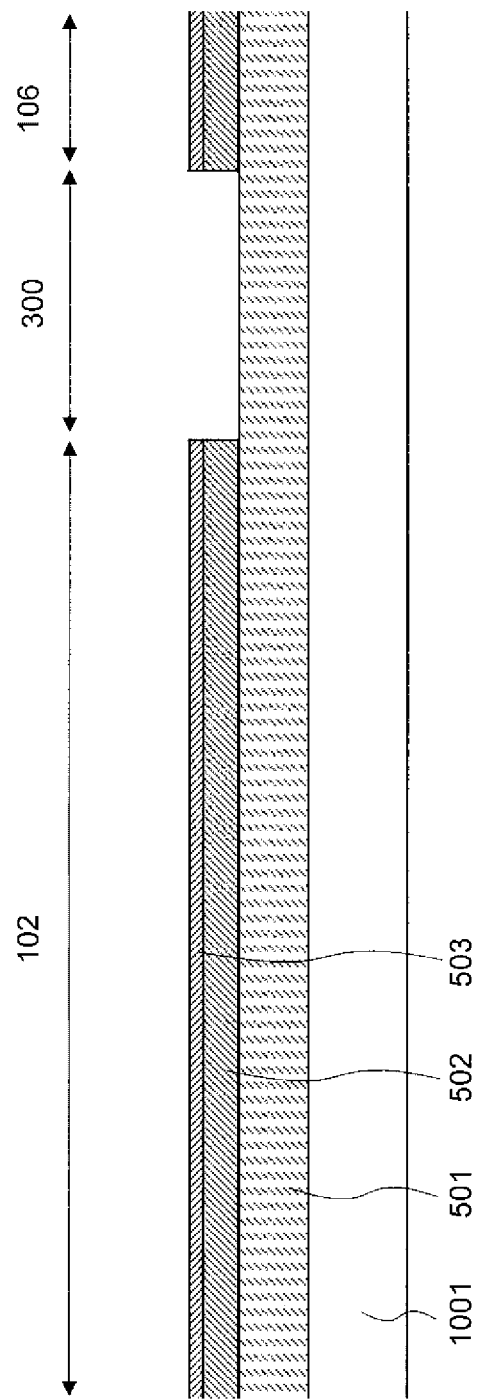

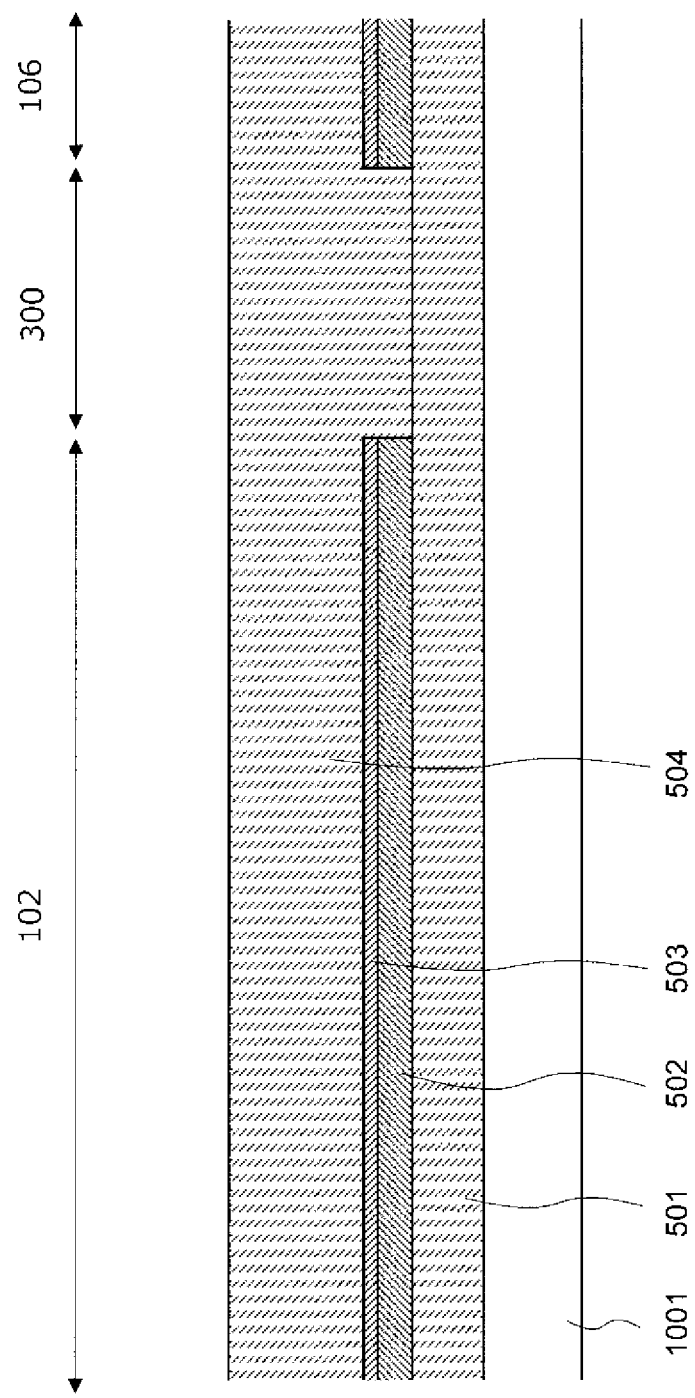

DISPLAY DEVICE INCLUDING BENDING REGION INCLUDING LAMINATED FIRST AND SECOND RESIN LAYERS

CROSS REFERENCE TO RELATED APPLICATIONS

This application is a continuation of U.S. application Ser. No. 16/922,236 filed Jul. 7, 2020, and which is based upon and claims the benefit of priority from the prior Japanese Patent Application No. 2018-005057 filed on Jan. 16, 2018, and PCT Application No. PCT/JP2019/000518 filed on Jan. 10, 2019, the entire contents of each of which are incorporated herein by reference.

FIELD

One embodiment of the present invention relates to a display device and a manufacturing method of the display device. One embodiment of the present invention relates to a flexible display device formed using a flexible substrate and a manufacturing method of the flexible display device.

BACKGROUND

An example of display devices includes a liquid crystal display device and an organic electroluminescence (Electroluminescence: EL) display device. These display devices include, in each of a plurality of pixels formed on a substrate, a liquid crystal element or an organic light-emitting element (hereinafter, the light-emitting element) as a display element. The liquid crystal element includes a layer containing a compound showing a liquid crystal property (hereinafter referred to as a liquid crystal layer) between a pair of electrodes, and the light-emitting element includes a layer containing an organic compound showing an electroluminescence property (hereinafter referred to as an electroluminescent layer or an EL layer). Then, the liquid crystal element is driven by applying a voltage between the pair of electrodes, the light-emitting element is driven by passing a current.

In the aforementioned display device, by using a flexible substrate, it is possible to impart flexibility to the entire display device. This provides a display device that is partially or wholly curved, or a display device that is freely deformable by the user. A region around a display region of the display device (hereinafter, also referred to as "peripheral region", or "picture frame region") by folding the substrate so as to be positioned toward the back side of the display region, to achieve a narrow frame display device is disclosed (e.g., Japanese laid-open patent publication No. 2012-128006).

SUMMARY

A display device according to an embodiment of the present invention includes the display device includes a substrate including a first resin layer, a second resin layer overlapping the first resin layer, and a first inorganic insulating layer between the first resin layer and the second resin layer, and having flexibility, a display region provided on the substrate, a terminal region arranged outside the display region on the substrate, and a bending region arranged between the display region and the terminal region. A thickness of the second resin layer is larger than a thickness of the first resin layer. The substrate includes a first region and a second region. The first resin layer, the first inorganic insulating layer, and the second resin layer are laminated in the first region. The first resin layer and the second resin layer are laminated in the second region and the first inorganic insulating layer is not laminated in the second region. The first region overlaps the display region and the second region overlaps the bending region.

A manufacturing method of display device according to an embodiment the present invention includes forming a first resin layer on a supporting substrate, forming a first inorganic insulating layer on the first resin layer, removing a part of the first inorganic insulating layer so as to expose a part of the first resin layer, forming a substrate on the supporting substrate by forming a second resin layer on the first inorganic insulating layer and the part of the first resin layer, forming a display region including pixels and a terminal region including terminals outside the display region on the second resin layer, forming a sealing film covering the display region, and peeling the supporting substrate from the substrate. The part of the first resin layer which is exposed by removing the part of the first inorganic insulating layer includes a region between the display region and the terminal region.

BRIEF DESCRIPTION OF DRAWINGS

FIG. 3 is a plan view showing a display device according to an embodiment of the present invention;

FIG. 4 is a cross-sectional view showing a display device according to an embodiment of the present invention;

FIG. 5 is a cross-sectional view showing a display device according to an embodiment of the present invention;

FIG. 6B is a cross-sectional view showing a display device according to an embodiment of the present invention;

FIG. 6C is a cross-sectional view showing a display device according to an embodiment of the present invention;

DESCRIPTION OF EMBODIMENTS

Figure 1:
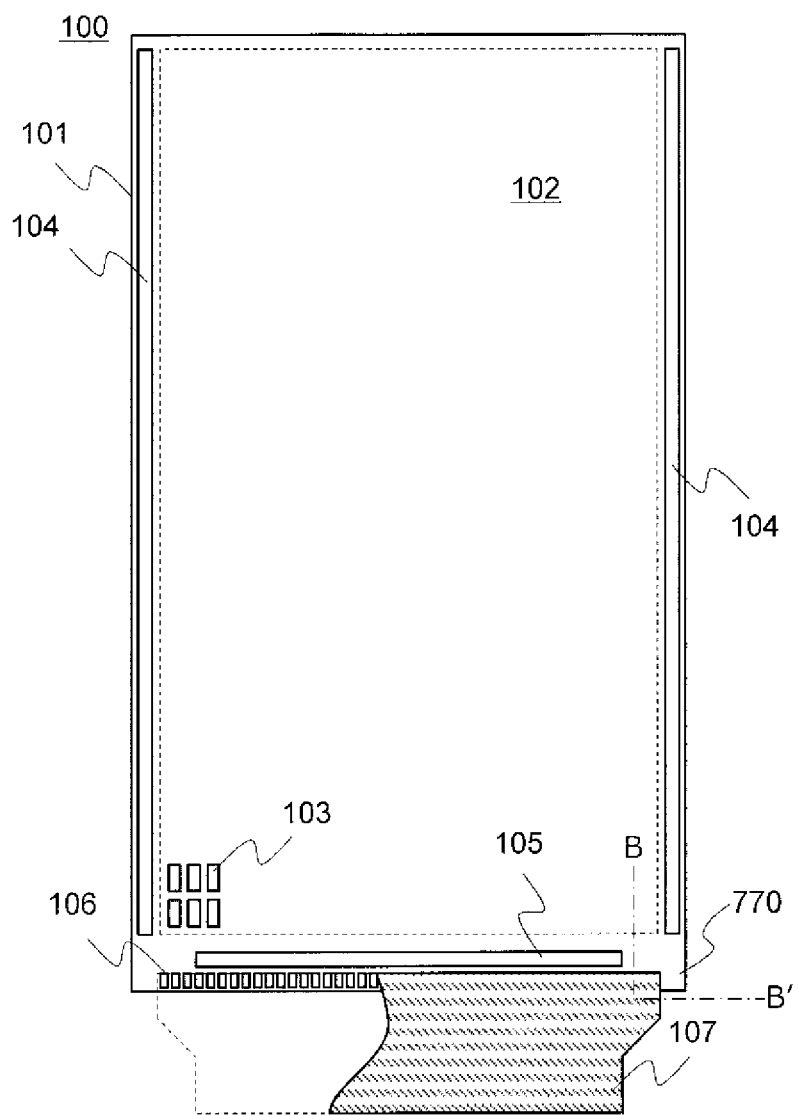
FIG. 1 is a schematic top view showing a display device according to an embodiment of the present invention.

One of object of one embodiment of the present invention is to provide a display device capable of maintaining high reliability even when a substrate having flexibility is bent or curved.

Hereinafter, in each embodiment of the present invention will be described with reference to the drawings and the like. However, the present invention may be implemented in various modes without departing from the gist of the technical idea thereof and is not construed as being limited to the description of the embodiments exemplified below.

The drawings may be schematically represented in terms of width, thickness, shape, and the like of each part as compared with actual embodiments for the sake of clarity of description, but are merely examples, and the illustrated shape itself is not intended to limit the interpretation of the present invention. In the drawings, elements having the same functions as those described with reference to the drawings already described in the specification are denoted by the same reference numerals even in other drawings, and overlapping descriptions are omitted in some cases.

In the present invention, in the case where one film is processed to form a plurality of films, the plurality of films may have different functions or roles, and each structure may have a different base film on which it is formed. However, the plurality of films is derived from the film formed in the same step as the same layer, and have the same layer structure and are formed of the same material. Therefore, the plurality of films is defined as being present in the same layer.

In expressing a mode of arranging another structure on a certain structure, the case of simply expressing "above" includes both the case of arranging another structure directly above a certain structure in contact with the structure and the case of arranging another structure above the certain structure through another structure, unless otherwise specified.

The phrase "one structure is exposed from another structure" means a region in which a portion of one structure is not covered by another structure. However, this includes the case where a portion not covered by the other structure is covered by still another structure.

Embodiment 1

Referring to FIG. 1 to FIG. 8, the structure of a display device 100 according to an embodiment of the present invention will be described.

FIG. 1 is a schematic top view of the display device 100. The display device 100 has a substrate 101, on one surface of the substrate 101 is provided with various conductive layers, semiconductor layers, and insulating layers patterned to the desired shape. Using these conductive layers, semiconductor layers, and insulating layers, a plurality of pixels 103 is formed. Driving circuits (a gate driver circuit 104 and a source driver circuit 105) for driving the plurality of pixels 103 may be formed on the substrate 101 simultaneously with the plurality of pixels 103 using the above-described conductive layers, semiconductor layers, and insulating layers, or an IC chip may be mounted on one surface of the substrate 101. The plurality of pixels 103 is arranged, for example, in a matrix, and a display region 102 is formed by these sets.

The gate driver circuit 104 and the source driver circuit 105 are located on a peripheral region 770 of the display region 102. From the display region 102, the gate driver circuit 104, and the source driver circuit 105, various wirings (not shown) formed of patterned conductive layers extend to one side of the substrate 101. Each wiring is connected to one of a plurality of terminals 106 located near an end portion of the substrate 101. A region that contains the plurality of terminals 106 is also known as a terminal region. The plurality of terminals 106 is connected to a flexible printed circuit board 107 (Flexible Printed Circuit: FPC). If the aforementioned driving circuit is provided by the IC chip, it may be mounted on the flexible printed circuit board 107 rather than on the substrate 101.

Video signals and various control signals are supplied through the flexible printed circuit board 107 from a controller (not shown) provided outside the display device 100. The video signals are processed by the source driver circuit 105 and input to the plurality of pixels 103. Various control signals are input to the gate driver circuit 104, and the source driver circuit 105.

In addition to the video signals and the various control signals, power for driving the gate driver circuit 104, the source driver circuit 105, and the plurality of pixels 103 is supplied to the display device 100. Each of the plurality of pixels 103 has the light-emitting element to be described later. A part of the power supplied to the display device 100 is supplied to the respective light-emitting element of the plurality of pixels 103 to cause the light-emitting element to emit light.

Figure 2:
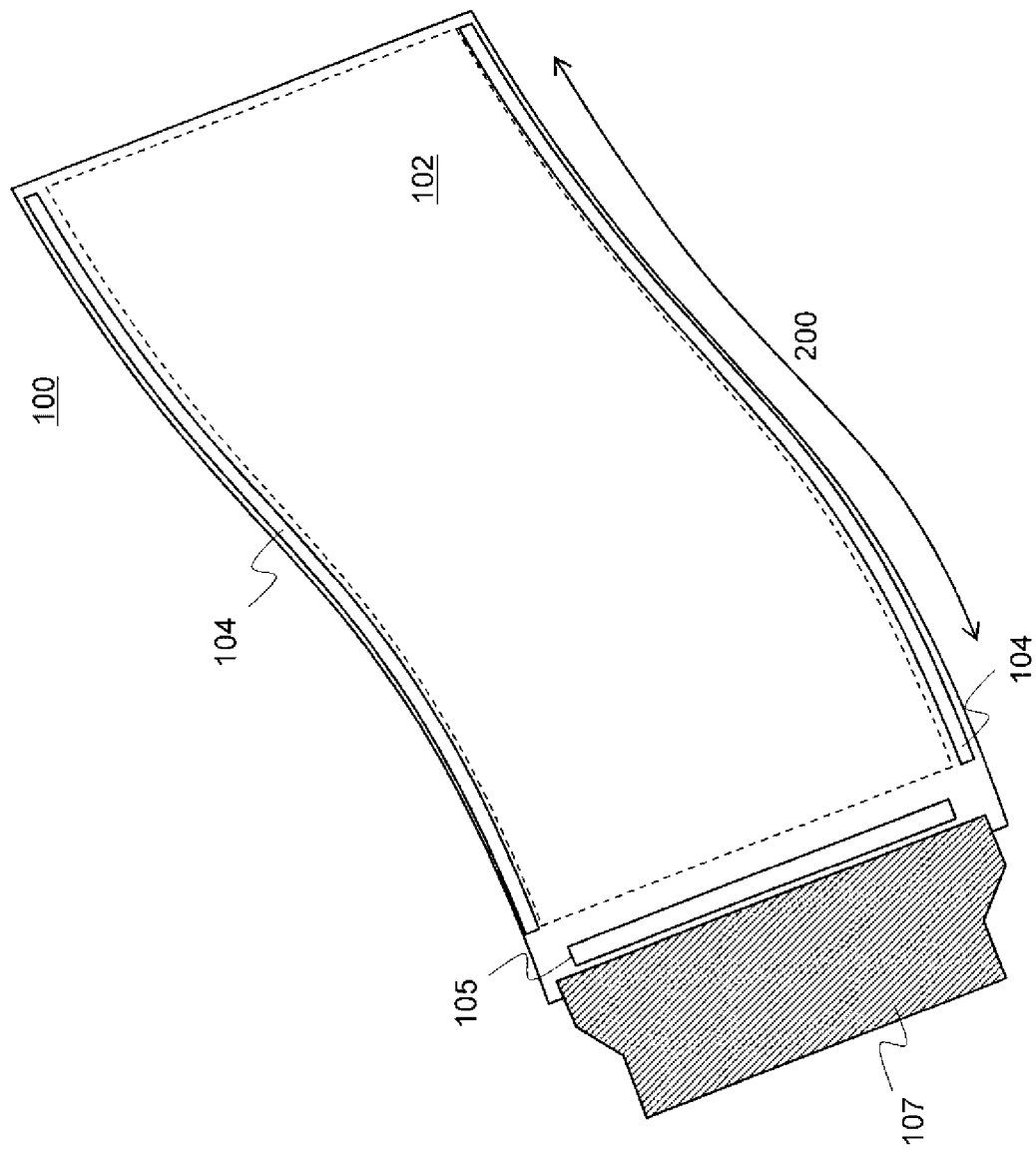
FIG. 2 is a plan view showing a display device according to an embodiment of the present invention.

By using the substrate having flexibility as the substrate 101, it is possible to impart flexibility to the display device 100 as shown in FIG. 2 to FIG. 4. For example, as shown in FIG. 2, a bendable region 200 is provided over the entire display region 102, it can be applied to highly designable electronic devices the display region 102 is curved surface shaped. The display device 100 may be applied to an electronic device in which the display region 102 is stored in a roll-like shape.

As shown in FIG. 3 and FIG. 4, the substrate 101 is provided with a bending region 300 between the display region 102 and the flexible printed circuit board 107. By bending the substrate 101 in the direction of an arrow 301 in the bending region 300 so as to overlap the source driver circuit 105 and the flexible printed circuit board 107 on a back surface side of the display region 102, it is possible to reduce the frame size of the display device 100.

FIG. 4 is a cross-sectional view taken along A-A' line shown in FIG. 3. The substrate 101 can be folded as indicated by the arrow 301. Thus, the source driver circuit 105 and the flexible printed circuit board 107 are arranged so as to overlap the back surface side of the display region 102. Therefore, the display device 100 can be narrowed frame as indicated by a width 302. Inside the folded portion, a spacer 303 may be provided to retain the cross-sectional form of the substrate 101.

<Structure of the Substrate 101>

FIG. 5 is a cross-sectional view of the display device 100 according to an embodiment of the present invention. FIG. 5 shows an enlarged view of a part of the display device. In the display region 102, the substrate 101 has a stacked structure including a first resin layer 501, a first inorganic insulating layer 502, an inorganic material layer 503, and a second resin layer 504. In the display region 102, a functional layer 505 including a plurality of pixels formed using the conductive layer, the semiconductor layer, and the insulating layer is formed on the substrate 101, a sealing film 506 is formed on the functional layer 505. In the bending region 300, the substrate 101 has a stacked structure of the first resin layer 501 from which the first inorganic insulating layer 502 and the inorganic material layer 503 have been removed and the second resin layer 504.

As the first resin layer 501 and the second resin layer 504, for example, an organic resin such as acrylic, polyimide, polyethylene terephthalate, or polyethylene naphthalate can be used. The first resin layer 501 and the second resin layer 504 may be layers using the same material or layers using different materials.

Inorganic materials such as a silicon oxide, a silicon nitride, or a silicon oxynitride can be used as the first inorganic insulating layer 502. By providing the first inorganic insulating layer 502 between the first resin layer 501 and the second resin layer 504, it is possible to prevent moisture and other contaminants from entering the functional layer 505 from the first resin layer 501 through the second resin layer 504.

The inorganic material layer 503 is provided between the first inorganic insulating layer 502 and the second resin layer 504. As the inorganic material layer 503, for example, a layer containing silicon such as silicon oxide or amorphous silicon can be used. The resin layer and the inorganic insulating layer differ in the stresses remaining in the film due to the differences in their materials and the process of forming them. As a result, the adhesion at the interface between the two is deteriorated. The deterioration of the adhesion is particularly conspicuous when the resin layer is formed on the inorganic insulating layer. Therefore, in this embodiment, by providing the inorganic material layer 503 having good adhesion to both of the first inorganic insulating layer 502 and the second resin layer 504, adhesion between first inorganic insulating layer 502 and the second resin layer 504 can be improved. Although not shown, as the substrate 101, a structure may be employed in which the inorganic material layer 503 is provided between the first inorganic insulating layer 502 and the second resin layer 504, and the inorganic material layer is further provided between the first resin layer 501 and the first inorganic insulating layer 502. As the substrate 101, the inorganic material layer 503 between the first inorganic insulating layer 502 and the second resin layer 504 may be omitted, and the inorganic material layer may be provided between the first resin layer 501 and the first inorganic insulating layer 502.

However, when the substrate 101 is folded, the presence of the inorganic insulating layer in the bending region 300 causes cracks in the inorganic insulating layer. The cracks in the inorganic insulating layer cause moisture and other contaminants to enter the functional layer 505 from the cracks. If moisture or contaminants that have entered the functional layer 505 enter the light-emitting element in the pixel, the light-emitting element may be degraded. This may reduce the reliability of the display device.

Therefore, the display device 100 according to the present embodiment has the stacked structure including the first resin layer 501, the first inorganic insulating layer 502, the inorganic material layer 503, and the second resin layer 504 in at least the display region 102 of the substrate 101. The substrate 101 has, in the bending region 300, a stacked structure of the first resin layer 501 from which the first inorganic insulating layer 502 and the inorganic material layer 503 have been removed and the second resin layer 504.

The substrate 101, in the display region 102, the first inorganic insulating layer 502 and the inorganic material layer 503 are provided between the first resin layer 501 and the second resin layer 504. Thus, it is possible to prevent moisture and other contaminants from entering the functional layer 505 from the first resin layer 501 through the second resin layer 504. In the bending region 300, the first inorganic insulating layer 502 and the inorganic material layer 503 between the first resin layer 501 and the second resin layer 504 have been removed. As a result, in the bending region 300, since a stacked structure is formed between the first resin layer 501 and the second resin layer 504, the bending resistance of the substrate 101 can be improved.

<Manufacturing Method of the Substrate 101>

Next, a manufacturing method of the substrate 101 will be described by referring to FIG. 6A to FIG. 6C.

Figure 6A:
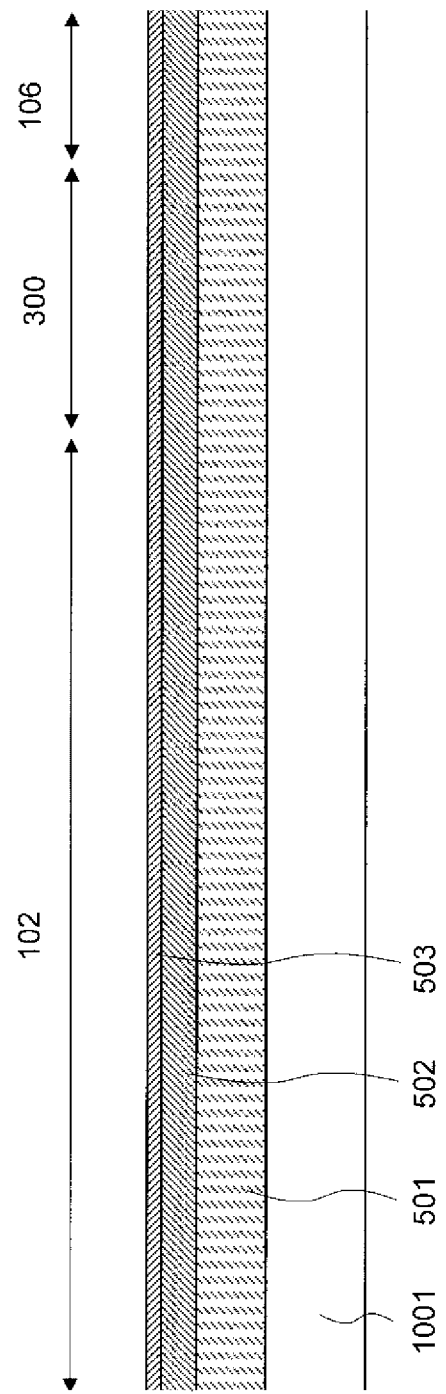
FIG. 6A is a cross-sectional view showing a display device according to an embodiment of the present invention.

FIG. 6A is a diagram illustrating a process of forming the first resin layer 501, the first inorganic insulating layer 502, and the inorganic material layer 503 on a support substrate 1001. First, a resin material such as acrylic, polyimide, polyethylene terephthalate, or polyethylene naphthalate is formed on the support substrate 1001 by a coating method, and then a first heat treatment is performed. Thus, the first resin layer 501 can be formed. Next, the first inorganic insulating layer 502 is formed of the silicon oxide, the silicon nitride, or the silicon oxynitride on the first resin layer 501 by a vapor phase growth method such as a CVD method. A thickness of the first inorganic insulating layer 502 is preferably 20 nm or more and 100 nm or less. Thereafter, the inorganic material layer 503 is formed of silicon oxide or amorphous silicon by the CVD method. A thickness of the inorganic material layer 503 is preferably 5 nm or more and 20 nm or less. As the inorganic material layer 503, amorphous silicon is preferably used.

FIG. 6B is a diagram illustrating a process of removing the first inorganic insulating layer 502 and the inorganic material layer 503 in the bending region 300. A mask is formed on a region other than the bending region 300 on the first inorganic insulating layer 502 and the inorganic material layer 503, and the first inorganic insulating layer 502 and the inorganic material layer 503 of the bending region 300 are removed by an etching process.

FIG. 6C is a diagram illustrating a process of forming the second resin layer 504 on the display region 102, the bending region 300, and the terminal 106. On the inorganic material layer 503 and the first resin layer 501, a resin material such as acrylic, polyimide, polyethylene terephthalate, or polyethylene naphthalate is formed by the coating method, and then a second heat treatment is performed. Thus, the second resin layer 504 can be formed.

By the above process, the substrate 101 can be formed.

In the first heat treatment and the second heat treatment at the time of forming the first resin layer 501 and the second resin layer 504, gas components are desorbed from the first resin layer 501 and the second resin layer 504. For example, during the second heat treatment to form the second resin layer 504, the gas components are also desorbed from the first resin layer 501. However, since the first inorganic insulating layer 502 is formed on the first resin layer 501, the desorbed gas components stay in the vicinity of the interface between the first resin layer 501 and the first inorganic insulating layer 502. As a result, peeling may occur at the interface between the first resin layer 501 and the first inorganic insulating layer 502. This desorption of the gas components occurs in a larger amount with a larger volume of the first resin layer 501. Therefore, in this embodiment, the volume is reduced by reducing the film thickness of the first resin layer 501 to be smaller than the film thickness of the second resin layer 504, and the desorption of the gas components from the first resin layer 501 is formed to be as small as possible.

In the present embodiment, as shown in FIG. 5, the thickness of the first resin layer 501 is preferably smaller than the thickness of the second resin layer 504. For example, it is preferable that the film thickness of the first resin layer 501 is set to 70% or less, preferably about 40% to 60% of the film thickness of the second resin layer 504. Specifically, the thickness of the first resin layer 501 is about 50% of the thickness of the second resin layer 504.

The film thickness of the substrate 101 is preferably a thickness that achieves both flexible enough to be bent or folded as shown in FIG. 2 to FIG. 4 and strong enough not to cause breakage by bending. The substrate 101 includes the above-mentioned stacked structure, and the film thickness of the substrate 101 may be, for example, 100 μm or less, preferably 50 μm or less. More preferably, the film thickness of the substrate 101 is about 10 μm to 30 μm. The film thickness of the second resin layer 504 is sufficiently larger than the film thickness of the first inorganic insulating layer 502 and the film thickness of the inorganic material layer 503. Therefore, the film thickness of the substrate 101 of the region from which the first inorganic insulating layer 502 and the inorganic material layer 503 have been removed is within the above-mentioned film thickness range, and the film thickness of the substrate 101 of the region from which the first inorganic insulating layer 502 and the inorganic material layer 503 have not been removed is within the above-mentioned film thickness range.

The first resin layer 501 and the second resin layer 504 are respectively baked at about 450° C. to 500° C. In this embodiment, the maximum value of the second heat treatment of the second resin layer 504 is set so as not to exceed the maximum value of the first heat treatment of the first resin layer 501. As described above, in the second heat treatment of the second resin layer 504, the first resin layer 501 is also heated at the same time, but the desorption of the gas components from the first resin layer 501 is small unless the maximum value of the baking temperature is reached when the first resin layer 501 is baked in advance. Temporarily, at the time of the second heat treatment of the second resin layer 504, when exceeding the maximum value of the temperature of the first heat treatment of the first resin layer 501, since the first resin layer 501 has no heating history thereof, desorption of the new gas components occurs. Therefore, by setting the maximum value of the temperature of the second heat treatment of the second resin layer 504 so as not to exceed the maximum value of the first heat treatment temperature of the first resin layer 501, it is possible to suppress the desorption of the gas components from the first resin layer 501 during the second heat treatment of the second resin layer 504.

<Structure of the Display Device>

The structure of the display device 100 according to the present embodiment will be described referring to FIG. 7 and FIG. 8.

Figure 7:
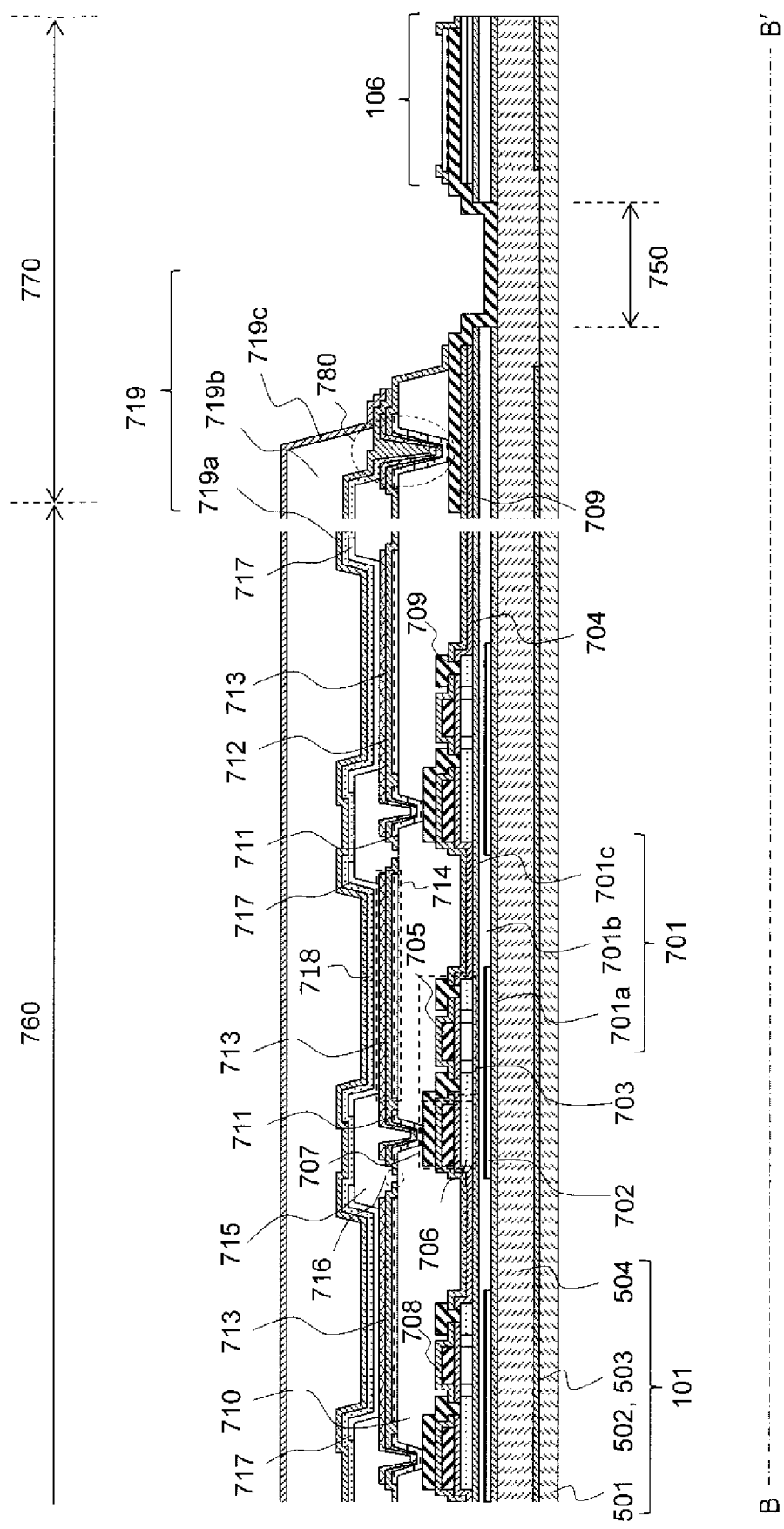
FIG. 7 is a cross-sectional view showing a display device according to an embodiment of the present invention.

FIG. 7 is a cross-sectional view taken along B-B' line of the display device 100 shown in FIG. 1. FIG. 7 mainly shows the display region 102 including a transistor structuring the pixel, the terminal 106, and a bending region 750 for folding the peripheral region 770 including the terminal 106.

As described above, the substrate 101 has the first resin layer 501, the first inorganic insulating layer 502, the inorganic material layer 503, and the second resin layer 504. In the bending region 750 of the substrate 101, the first inorganic insulating layer 502 and the inorganic material layer 503 have been removed. An undercoat layer 701 is provided on the substrate 101. In FIG. 7, the undercoat layer 701 has a three-layer structure of a first layer 701a, a second layer 701b, and a third layer 701c. By providing silicon oxide as the first layer 701a, the adhesion of the substrate 101 to the second resin layer 504 can be improved. By providing the silicon nitride as the second layer 701b, moisture and other contaminants from the outside can be blocked. By providing silicon oxide as the third layer 701c, hydrogen atoms contained in the silicon nitride of the second layer 701b can be prevented from diffusing into a semiconductor layer 706 contained in the functional layer 505. The undercoat layer 701 is not limited to the above structure, and may be a single layer structure or a double layer structure, or may be a stacked structure of four or more layers.

The undercoat layer 701 may be provided with a light shielding layer 702 in accordance with a portion where the transistor is to be provided later. The light shielding layer 702 can suppress a change in transistor property due to the penetration of light from a back surface of the channel of the transistor or the like. If the light shielding layer 702 is a conductive layer, the light blocking layer 702 can function as a back gate which controls the threshold value of the transistor by applying a predetermined potential. In FIG. 7, a light shielding layer 702 is provided in an island shape over the first layer 701a so as to correspond to a portion where a transistor is formed. A second layer 701b and a third layer 701c are stacked on the light shielding layer 702. The undercoat layer 701 is provided so as to enclose the light shielding layer 702. One embodiment of the present invention is not limited thereto, and the light shielding layer 702 may be provided on the substrate 101, and the first layer 701a, the second layer 701b, and the third layer 701c may be provided thereon as the undercoat layer 701.

The transistor is provided on the undercoat layer 701. The transistor has the semiconductor layer 706, a gate insulating film 704, and a gate electrode 705. As the semiconductor layer 706, amorphous silicon, polysilicon, or an oxide semiconductor can be used. As the gate insulating film 704, the silicon oxide or the silicon nitride can be used. As the gate electrode 705, titanium, molybdenum, tungsten, or the like can be used. The gate electrode 705 also functions as a storage capacitor line. In other words, the semiconductor layer 706, the gate insulating film 704, and the gate electrode 705, it is possible to form a storage capacitor 707.

The transistor shown in FIG. 7 is a drive transistor and is an Nch type transistor. The Nch type transistor has a structure in which a low concentration impurity region is provided between a channel region and a source region or a drain region (high concentration impurity region). As the transistor, here, although only the Nch type transistor is shown, a Pch type transistor may be provided together with the Nch type transistor.

An interlayer insulating layer 708 is provided on the transistor. As the interlayer insulating layer 708, a silicon nitride film or a silicon oxide film can be used. The interlayer insulating layer 708 has a contact hole that reaches the semiconductor layer 706. The interlayer insulating layer 708 is formed with the contact hole, and at the same time, the interlayer insulating layer 708 and the gate insulating film 704 at a point corresponding to the bending region 750 are also removed. Furthermore, by removing the interlayer insulating layer 708 and the gate insulating film 704, since the undercoat layer 701 is exposed, which is also removed by patterning. After the undercoat layer 701 is removed, the second resin layer 504 constituting the substrate 101 is exposed. At this time, though not particularly shown, the surface of the second resin layer 504 may be partially eroded through the etching of the undercoat layer 701 to cause film reduction.

A conductive layer 709 serving as a source electrode, a drain electrode, and a routing wiring is provided on the interlayer insulating layer 708. As the conductive layer 709, a three-layer stacked structure of titanium, aluminum, and titanium can be used. A part of the storage capacitor 707 is formed using the interlayer insulating layer 708, an electrode formed of a conductive layer in the same layer as the gate electrode 705 of the transistor and an electrode formed of a conductive layer in the same layer as the source/drain wiring of the transistor. The routing wiring extends to an end portion of a peripheral of the substrate 101. The routing wiring constitutes the terminal 106 that connects the flexible printed circuit board 107 and the driver IC. The terminal 106 may be formed of the conductive layer of the same layer as the gate electrode 705.

A planarization film 710 is provided to cover the transistor and the routing wiring. As the planarization film 710, an organic material such as photosensitive acrylic or polyimide can be used. The organic material is superior in flatness to an inorganic insulating material formed by the CVD or the like.

The planarization film 710 is partially removed in the pixel contact portion and the peripheral region 770. The portion where the conductive layer 709 is exposed by removing the planarization film 710 is covered with a transparent conductive film 711. For example, an ITO (Indium tin oxide) is used as the transparent conductive film 711. On the transparent conductive film 711 is covered with an inorganic insulating layer 712. As the inorganic insulating layer 712, the silicon nitride can be used. Then, a pixel electrode 713 is formed by opening the inorganic insulating layer 712 in the pixel contact portion. Here, the pixel electrode is formed as a reflective electrode, is a three-layer stacked structure of IZO, Ag, IZO. In a pixel portion, an additional capacitance 714 is formed by the transparent conductive film 711, the inorganic insulating layer 712, and the pixel electrode 713. On the other hand, the transparent conductive film 711 is also formed on the surface of the terminal 106. The transparent conductive film on the terminal 106 is provided as a barrier film so that the exposed portion of the wiring is not damaged in the subsequent processes.

Incidentally, when patterning the pixel electrode 713, a part of the transparent conductive film 711 is exposed to the etching gas. However, by an annealing process performed between the formations of the transparent conductive film 711 to the pixel electrode 713, the transparent conductive film 711 is sufficiently resistant to the etching process of the pixel electrode 713.

On the pixel electrode 713, an insulating layer called a bank 715, which is serving as a barrier of a pixel region is provided. As the bank 715, an organic material such as photosensitive acrylic or polyimide is used as in the case of the planarization film 710. The bank 715 is preferably opened to expose the surface of the pixel electrode 713 as a light-emitting region, and an edge of the opening is preferably a smooth tapered shape. If the edge of the opening is a steep sharp, a coverage defect of the organic layer provided on the bank 715 occurs.

The planarization film 710 and the bank 715 have a portion in contact with each other through an opening 716 provided in the inorganic insulating layer 712. The portion is an opening for drawing the moisture and the gas desorbed from the planarization film 710 through the bank 715 through the heat treatment or the like after the bank 715 is formed. Here, moisture and the gas to be desorbed are the same phenomena as those to be desorbed from the first resin layer 501 and the second resin layer 504 at the time of forming the substrate 101 described above. By evolving the desorbed moisture and gas from the planarization film 710 to the bank 715 through the opening 716, peeling the interface between the planarization film 710 and the inorganic insulating layer 712 can be suppressed.

An organic layer 717 including the organic EL layer is provided on the pixel electrode 713 and the bank 715. In FIG. 7, although the organic layer 717 is shown as a single layer, a hole transport layer, a light-emitting layer, and an electron transport layer are stacked in this order from the pixel electrode 713. These layers may be formed by vapor deposition or may be formed by a coating of solvent dispersion. As shown in FIG. 7, the organic layer 717 may be selectively provided for each pixel or may be provided solidly on the entire surface covering a display region 760. When the organic layer 717 is provided solidly, a structure is employed that obtains white light in all the pixels and extracts a desired color wavelength portion by a color filter (not shown).

A counter electrode 718 is provided on the organic layer 717. In the present embodiment, since a top emission structure is employed, the counter electrode 718 needs to be optically transparent. The top emission structure is a structure in which light is emitted from the counter electrode 718 disposed on the substrate 101 with the organic layer 717 interposed therebetween. Here, as the counter electrode 718, an MgAg film is formed as a thin film to the extent that the emitted light from the organic EL layer is transmitted. According to the order of forming the organic layer 717 described above, the pixel electrode 713 side becomes the anode, the counter electrode 718 side becomes the cathode. The counter electrode 718 is formed over the display region 760 and a cathode contact portion 780 provided in the vicinity of the display region 102, is connected to the lower layer of the conductive layer 709 at the cathode contact portion 780, and is ultimately drawn out to the terminal 106.

A sealing film 719 is provided on the counter electrode 718. The sealing film 719 can prevent moisture from entering the organic layer 717 from outside. The sealing film 719 is required to have a gas barrier property. Here, a stacked layer structure of an inorganic insulating layer 719a, an organic insulating layer 719b, and an inorganic insulating layer 719c is shown as a stacked structure including the silicon nitride film as the sealing film 719. Although not shown in particular, a silicon oxide film or an amorphous silicon film may be provided as the inorganic material layer between the inorganic insulating layer 719a and the organic insulating layer 719b as described in the stacked layer step of the substrate 101.

Figure 8:
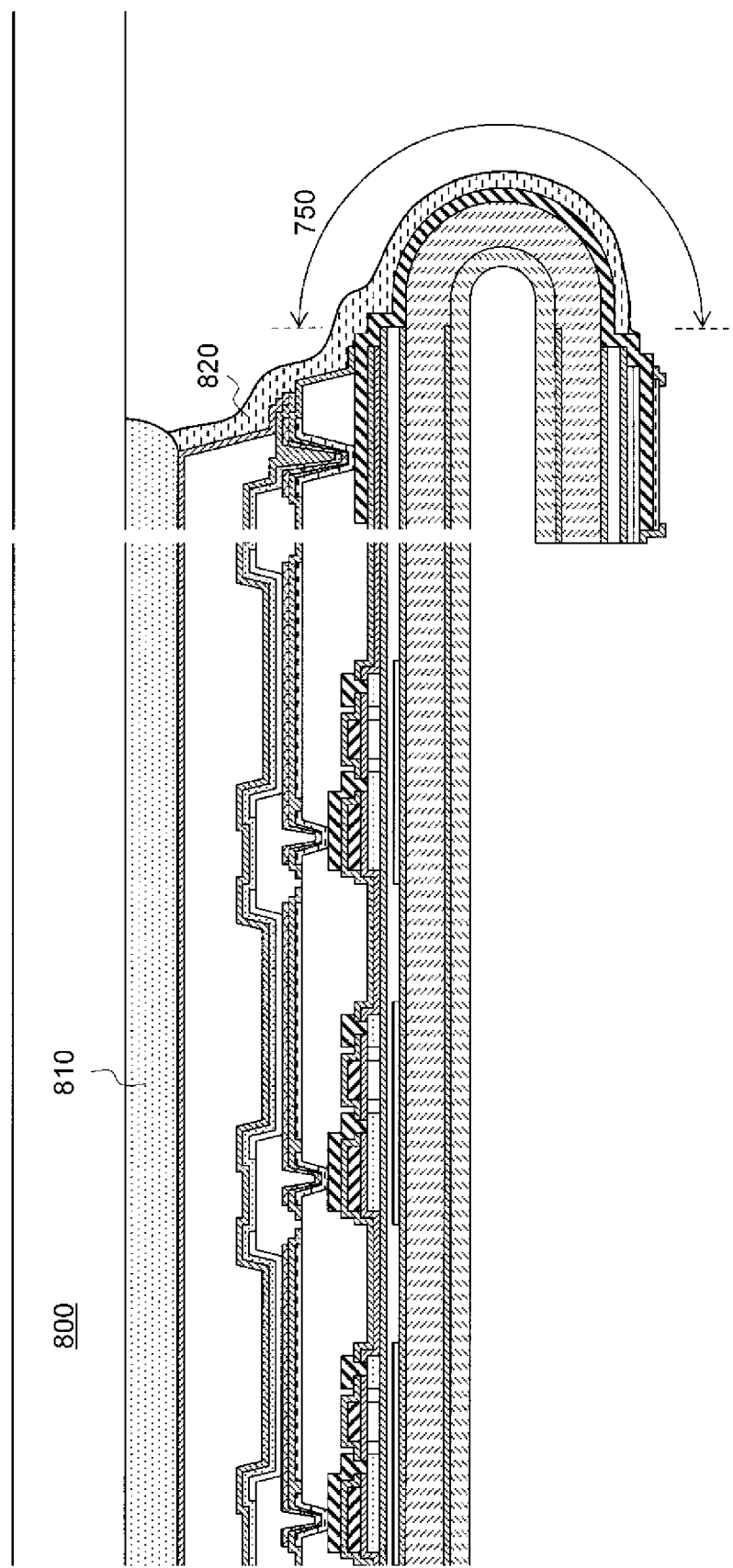
FIG. 8 is a cross-sectional view showing a display device according to an embodiment of the present invention.

As shown in FIG. 8, a cover member 800 is provided on the sealing film 719 via an adhesive member 810.

According to the display device shown in the present embodiment, the substrate 101 is formed so that the thickness of the second resin layer 504 is larger than the thickness of the first resin layer 501. Thus, desorption of the gas components from the first resin layer 501 is reduced as much as possible. The maximum value of the temperature at the time of the heat treatment of the second resin layer 504 is set so as not to exceed the maximum value of the temperature at the time of the heat treatment of the first resin layer 501. Thus, the desorption of the gas components from the first resin layer 501 during baking of the second resin layer 504 can be suppressed. As a result, peeling at the interface between the first resin layer 501 and the first inorganic insulating layer 502 can be suppressed.

As the substrate 101, the first inorganic insulating layer 502 is provided between the first resin layer 501 and the second resin layer 504. By providing the first inorganic insulating layer 502, it is possible to suppress moisture and other contaminants from entering the functional layer 505 through the first resin layer 501 and the second resin layer 504. The inorganic material layer 503 is provided between the first resin layer 501 and the first inorganic insulating layer 502 or between the first inorganic insulating layer 502 and the second resin layer 504. As a result, the adhesion between the first resin layer 501 and the first inorganic insulating layer 502 or between the first inorganic insulating layer 502 and the second resin layer 504 can be improved.

In the display device 100 shown in this embodiment, the first inorganic insulating layer 502 and the inorganic material layer 503 between the first resin layer 501 and the second resin layer 504 are removed in the bending region 750. As a result, in the bending region 750, the first resin layer 501 and the second resin layer 504 are in stacked structure with each other, so that the bending resistance of the substrate 101 can be improved. In the bending region 750, the inorganic insulating layer included in the functional layer 505 and the sealing film 506 as well as the first inorganic insulating layer 502 and the inorganic material layer 503 included the substrate 101 has been removed. Therefore, for securing the strength of the bending region, to cover the bending region 750, a resin coating 820 or the like may be provided on the conductive layer 709. As the resin coat 820, for example, it is preferable to use TUFFY manufactured by Hitachi Chemical Company.

Embodiment 2

Another embodiment of the display device of the present invention will be described with reference to FIG. 9.

In FIG. 7, the structure in which the inorganic insulating layer (the undercoat layer 701, the gate insulating film 704, and the interlayer insulating layer 708) provided on the upper layer than the substrate 101 is removed in the bending region 750 has been described. FIG. 9 shows a structure in which the first inorganic insulating layer 502 and the inorganic material layer 503 are also removed in the terminal 106. As shown in FIG. 9, after removing the interlayer insulating layer 708 and the undercoat layer 701, the second resin layer 504 may be subsequently removed.

As a result, it possible to form the substrate 101 in which the first inorganic insulating layer 502 and the inorganic material layer 503 are not provided in the bent region 750 and the terminal 106. The conductive layer 709 is provided to be in contact with the first resin layer 501. In one embodiment, the bending region 750 after removing the second resin layer 504 has a lower mechanical strength because the film thickness of the first resin layer 501 is thinner than that of the second resin layer 504. Therefore, it is very effective to provide the resin coat 820 in the bending region as shown in FIG. 8.

According to the structure of the display device shown in the present embodiment, the substrate 101 can be favorably bent by the structure in which the first inorganic insulating layer 502 and the inorganic material layer 503 do not extend in the bending region 750 and the terminal 106. In the bending region 750, the mechanical strength of the bending region 750 can be improved by providing the resin coat 820 after the substrate 101 is bent. Thus, it is possible to provide the display device capable of maintaining a high reliability even if curved or bent the substrate 101 having flexibility.

Embodiment 3

In the present embodiment, a method of forming the substrate 101 to the sealing film on the support substrate 1001 and then peeling the upper layer of the substrate 101 from the support substrate will be described referring to FIG. 10A to FIG. 10D.

Figure 9:
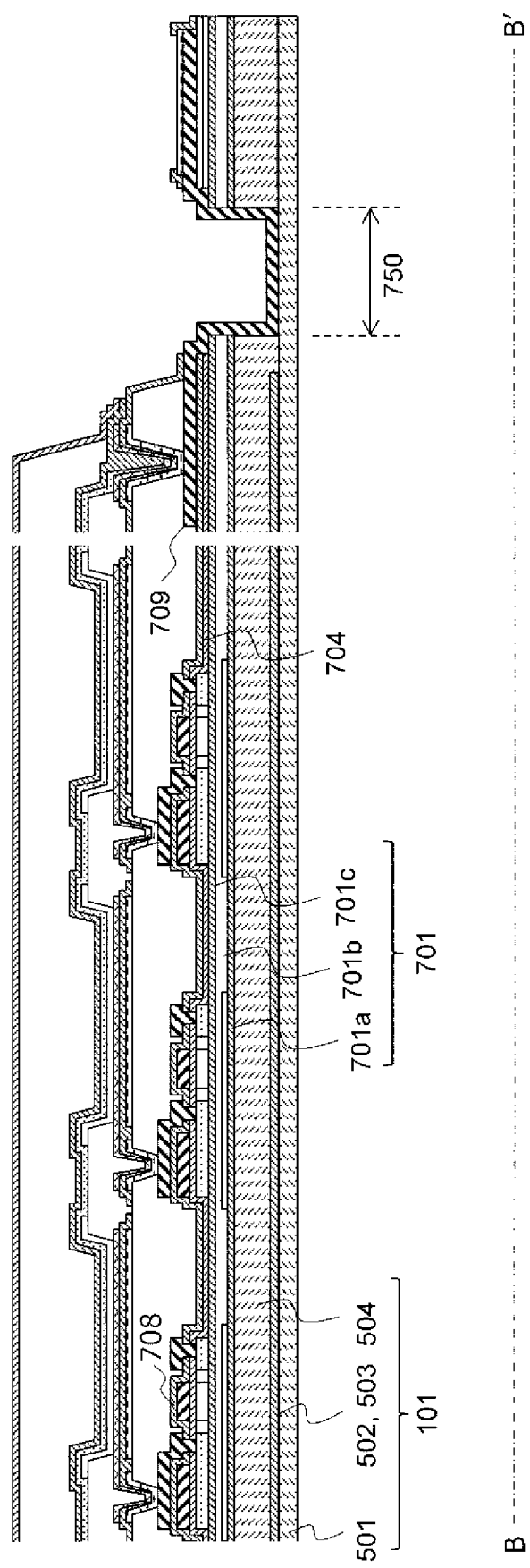
FIG. 9 is a cross-sectional view showing a display device according to an embodiment of the present invention.

When the substrate 101 is made of a material having flexibility, it is difficult for the substrate 101 to maintain flatness through the steps shown in FIG. 7 to FIG. 9. Therefore, when forming the display device having flexibility, first of all, it is preferable to form the substrate 101 to the sealing film 506 on the support substrate 1001.

Figure 10A:
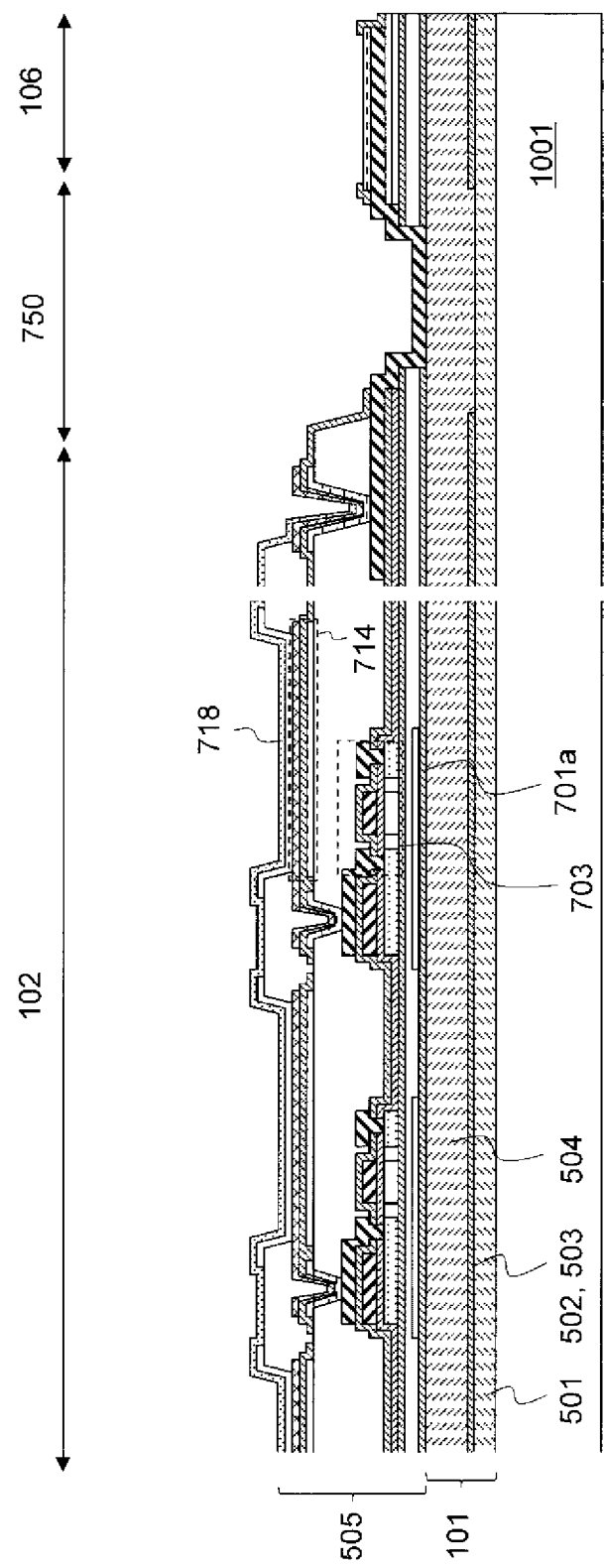
FIG. 10A is a cross-sectional view showing a manufacturing method of a display device according to an embodiment of the present invention.

As shown in FIG. 10A, the substrate 101, the display region 102 provided with the plurality of pixels having the transistor and the light-emitting element, the terminal region located the outside of the display region 102, and the bending region between the display region 102 and the terminal region are formed on the support substrate 1001.

Glass, quartz, or the like can be used as the support substrate 1001. The substrate 101 including the first resin layer 501, the first inorganic insulating layer 502, the inorganic material layer 503, and the second resin layer 504 is formed on the support substrate 1001. As described in the first embodiment, in the bending region 750 of the substrate 101, the first inorganic insulating layer 502 and the inorganic material layer 503 are removed so that the first resin layer 501 is in contact with the second resin layer 504. As shown in FIG. 9, in the terminal region where the terminal 106 is provided, the first inorganic insulating layer 502 and the inorganic material layer 503 may be removed and the first resin layer 501 may be in contact with the second resin layer 504.

The thickness of the first resin layer 501 is preferably smaller than the thickness of the second resin layer 504. For example, it is preferable that the film thickness of the first resin layer 501 is set to 70% or less, preferably about 40% to 60% of the film thickness of the second resin layer 504. Specifically, the film thickness of the first resin layer 501 is about 50% of the film thickness of the second resin layer 504. The first heat treatment is performed for the first resin layer 501, and the second heat treatment is performed for the second resin layer 504. At this time, the maximum value of the second heat treatment of the second resin layer 504 is set to be lower than the maximum value of the first heat treatment of the first resin layer 501. Thus, at the time of the second heat treatment of the second resin layer 504, it is possible to suppress the gas components desorption from the first resin layer 501. Therefore, it is possible to suppress stagnation of the desorbed gas components between the first resin layer 501 and the first inorganic insulating layer 502. As a result, peeling of the film from between the first resin layer 501 and the first inorganic insulating layer 502 can be suppressed.

Next, the functional layer 505 including the display region 102 and the gate driver circuit 104 in which the plurality of pixels formed using the conductive layer, the semiconductor layer, and the insulating layer are provided is formed on the substrate 101.

The undercoat layer 701 including the first layer 701a, the second layer 701b, and the third layer 701c is formed on the substrate 101. The light shielding layer 702 may be formed on the first layer 701a.

By forming the semiconductor layer 706 and the gate insulating film 704, and the gate electrode 705 on the undercoat layer 701, form the transistor. In the same layer as the gate electrode 705, a conductive layer for forming the storage capacitor together with a semiconductor layer 703 is also formed at the same time. Next, the interlayer insulating layer 708 is formed on the gate electrode 705. The contact hole is formed on the interlayer insulating layer 708, and at the same time, the interlayer insulating layer 708, the gate insulating film 704 and the undercoat layer 701 corresponding to the bending region 750 are removed.

The conductive layer 709 which functions as the source electrode, the drain electrode, and the routing wiring is formed on the interlayer insulating layer 708. A part of the storage capacitor 707 can be formed using an interlayer insulating layer 708, an electrode formed of a conductive layer in the same layer as the gate electrode 705 of the transistor, and an electrode formed of a conductive layer in the same layer as the source/drain wiring of the transistor. The routing wiring is formed to extend to the end portion of the periphery of the substrate 101. The routing wiring forms the terminal 106 that connects the flexible printed circuit board 107 and the driver IC. The terminal 106 may be formed of the conductive layer of the same layer as the gate electrode 705.

The planarization film 710 is formed on the conductive layer 709. Then, the planarization film 710 is removed at the pixel contact portion and a part of the peripheral region 770. The portion where the conductive layer 709 is exposed by removing the planarization film 710 is covered with the transparent conductive film 711. Next, the inorganic insulating layer 712 is formed on the planarization film 710 and the transparent conductive film 711.

The inorganic insulating layer 712 is opened at the pixel contact portion and the opening 716. Next, the pixel electrode 713 is formed on the inorganic insulating layer 712. The pixel electrode 713 is connected to the transparent conductive film 711 via the opening of the pixel contact portion. Then, the bank 715 is formed to cover the edge portion of the pixel electrode 713. At this time, the bank 715 has opened so that the surface of the pixel electrode 713 exposed as the light-emitting region, and the opening edge is formed to be a smooth tapered shape.

The organic layer 717 including the organic EL layer is formed on the pixel electrode 713 and the bank 715. As the organic layer 717, the hole transport layer, the light-emitting layer, and the electron transport layer are stacked in order from the pixel electrode 713 sides. Next, the counter electrode 718 is formed on the organic layer 717. The light-emitting element can be formed by the pixel electrode 713, the organic layer 717, and the counter electrode 718.

Figure 10B:
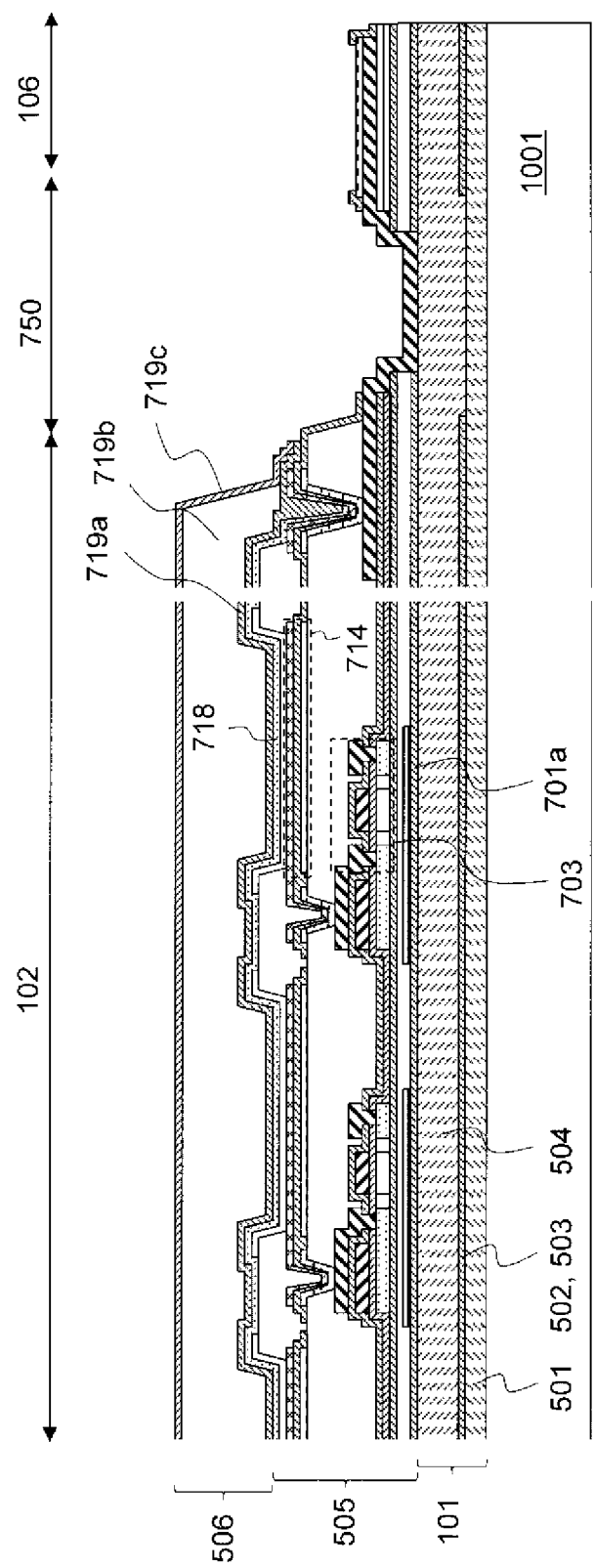
FIG. 10B is a cross-sectional view showing a manufacturing method of a display device according to an embodiment of the present invention.

Next, as shown in FIG. 10B, the sealing film 506 having the inorganic insulating layer 719a, the organic insulating layer 719b, and the inorganic insulating layer 719c is formed on the functional layer 505. The sealing film 506 is preferably formed so that the inorganic insulating layer 719a and the inorganic insulating layer 719c are in contact with each other in the end portion of the display region 760. This prevents moisture from entering the functional layer 505 from the end portion of the display region 760.

Through a series of processes for forming the substrate 101 to the sealing film 506 shown in FIG. 10A and FIG. 10B, maintaining the flatness of the substrate 101 by the support substrate 1001, so that the manufacturing processes including high-precision photolithography can be performed normally.

Figure 10C:
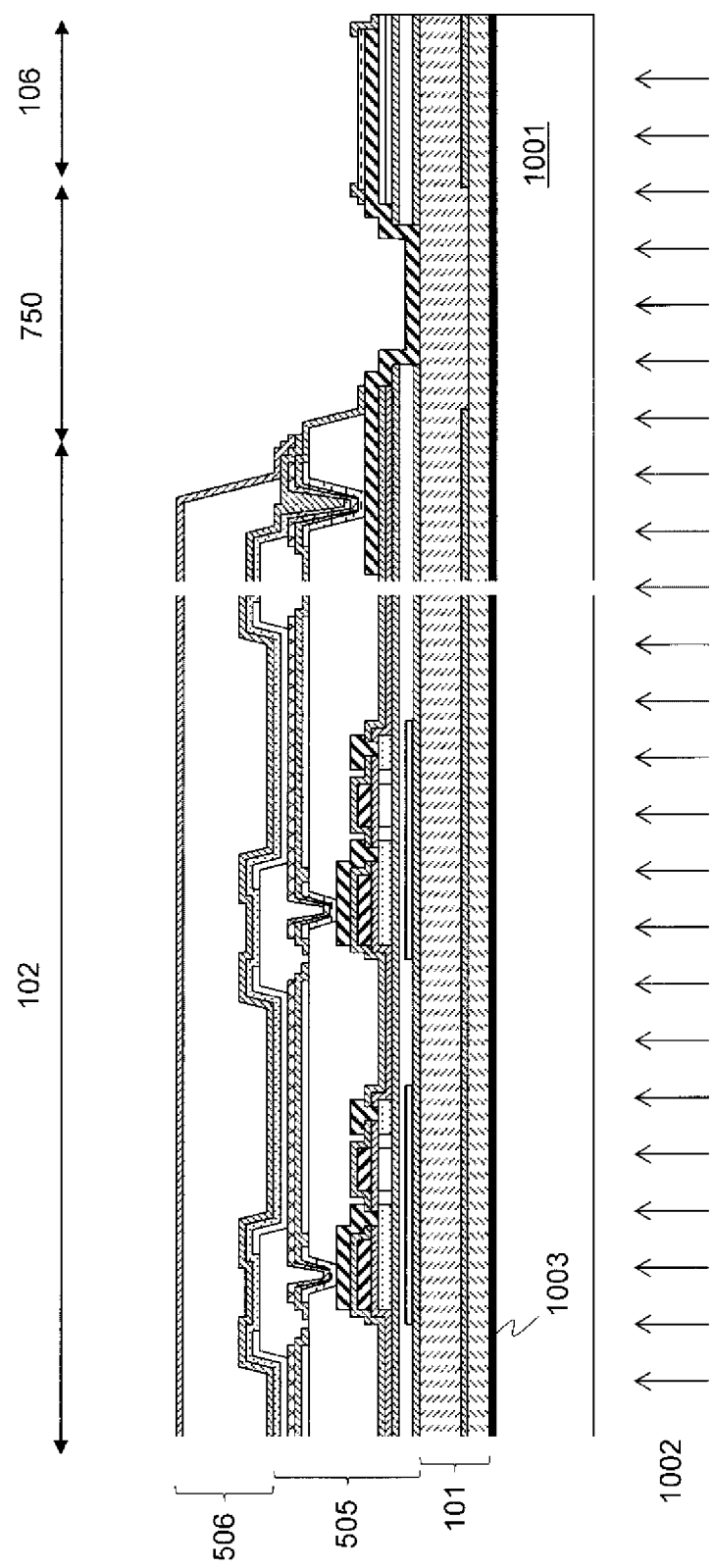
FIG. 10O is a cross-sectional view showing a manufacturing method of a display device according to an embodiment of the present invention.
FIG. 10D is a cross-sectional view showing a manufacturing method of a display device according to an embodiment of the present invention.

Subsequently, as shown in FIG. 10C, a laser irradiation process 1002 is performed from the side of the surface where the substrate 101 of the support substrate 1001 has not formed. By the laser irradiating treatment 1002, a part 1003 of the first resin layer 501 of the substrate 101 in contact with the support substrate 1001 is deteriorated, and the adhesiveness is lowered. This decrease in adhesion is brought by the first resin layer 501 being partially ablated or shrunk by heat.

Figure 10D:
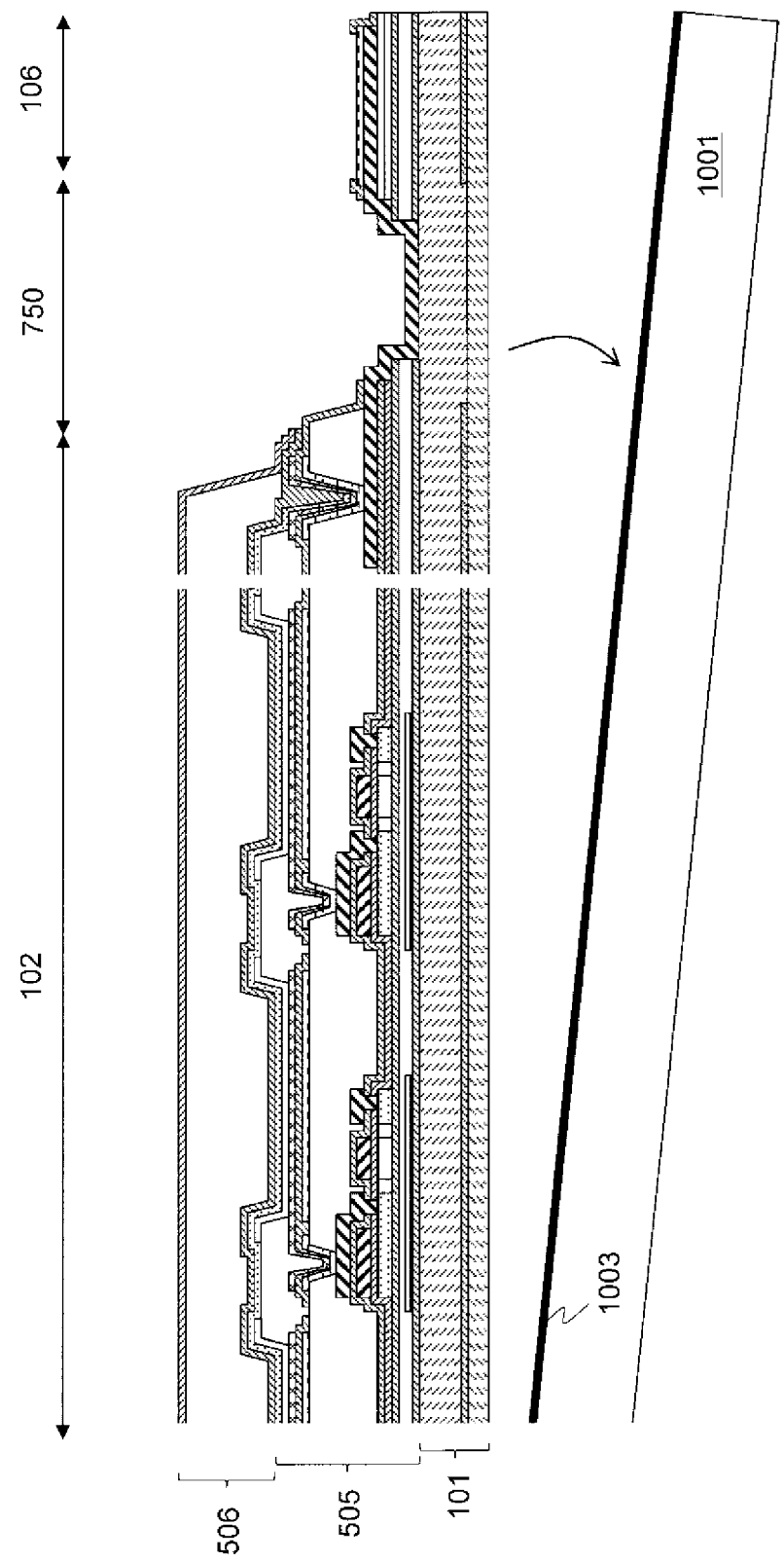

Thereafter, as shown in FIG. 10D, a physical force is applied between the support substrate 1001 and the substrate 101 to peel off at the interface therebetween. The display device 100 peeled from the support substrate 1001 can form the display device 100 as shown in FIG. 2 to FIG. 4 by the flexibility of the substrate 101.

After the process shown in FIG. 10D, fold the substrate 101 in the bending region 750. Then, the resin coat 820 as shown in FIG. 8 may be formed to enhance the strength of the bending region 750. Finally, by attaching the cover member 800 via the adhesive member 810, the display device shown in FIG. 8 can be formed.

According to the manufacturing method of the display device shown in this embodiment, since the flatness on the substrate 101 having flexibility is maintained, it is possible to perform the high-precision photolithography. Thus, the semiconductor layer, the insulating layer, and the conductive layer can be processed with high precision.

Within the scope of the present invention, it is understood that various modifications and amendments can be made by those skilled in the art, and that these modifications and amendments also fall within the scope of the present invention. For example, as long as the gist of the present invention is provided, a person skilled in the art who adds, deletes, or changes the design of components or adds, omits, or changes the conditions of processes to each of the above-described embodiments is included in the scope of the present invention.

What is claimed is:

1. A display device comprising:
   a substrate including a first resin layer, a second resin layer overlapping the first resin layer, and a first inorganic insulating layer between the first resin layer and the second resin layer, and having flexibility;
   a display region provided on the substrate;
   a terminal region arranged outside the display region on the substrate; and
   a bending region arranged between the display region and the terminal region, wherein
   a thickness of the second resin layer is larger than a thickness of the first resin layer,
   the substrate includes a first region and a second region,
   the first resin layer, the first inorganic insulating layer, and the second resin layer are laminated in the first region,
   the second region includes the first resin layer,
   the second resin layer and the first inorganic insulating layer are not laminated in the second region,
   the first region overlaps the display region and the second region overlaps the bending region, and
   the first resin layer is in direct contact with the second resin layer in the terminal region.

2. The display device according to claim 1, wherein the second region overlaps the terminal region.

3. The display device according to claim 2, wherein thickness of the first resin layer is 70% or less of thickness of the second resin layer.

4. The display device according to claim 3, further comprising:
   an inorganic material layer provided between the first resin layer and the first inorganic insulating layer or between the first inorganic insulating layer and the second resin layer.

5. The display device according to claim 4, wherein the first inorganic insulating layer includes silicon nitride.

6. The display device according to claim 5, wherein the inorganic material layer includes silicon oxide or amorphous silicon.

7. The display device according to claim 6, further comprising:
   a second inorganic insulating layer provided on the substrate;
   a semiconductor layer provided on the second inorganic insulating layer;

a third inorganic insulating layer provided on the semiconductor layer; and a gate electrode overlapping the semiconductor layer on the third inorganic insulating layer, wherein the second region includes a third region in which the first resin layer does not overlap the second inorganic insulating layer and the third inorganic insulating layer.

8. The display device according to claim 7, further comprising:

a fourth inorganic insulating layer provided on the third inorganic insulating layer in the first region, an organic insulating layer provided on the fourth inorganic insulating layer, and a fifth inorganic insulating layer provided on the organic insulating layer, wherein the fourth inorganic insulating layer is in contact with the fifth inorganic insulating layer in an edge of the first region, and the second region includes a fourth region in which the first resin layer does not overlap the fourth inorganic insulating layer and the fifth inorganic insulating layer.

* * * * *